(12) United States Patent
Dadvand et al.

(10) Patent No.: US 11,091,366 B2
(45) Date of Patent: *Aug. 17, 2021

(54) NICKEL LANTHANIDE ALLOYS FOR MEMS PACKAGING APPLICATIONS

(71) Applicant: Texas Instruments Incorporated, Dallas, TX (US)

(72) Inventors: Nazila Dadvand, Richardson, TX (US); Kathryn Schuck, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/774,529

(22) Filed: Jan. 28, 2020

(65) Prior Publication Data

US 2020/0165124 A1    May 28, 2020

Related U.S. Application Data

(63) Continuation of application No. 16/042,595, filed on Jul. 23, 2018, now Pat. No. 10,544,034.

(51) Int. Cl.
| | | |
|---|---|---|
| *H01L 23/52* | (2006.01) | |
| *H01L 29/40* | (2006.01) | |
| *B81B 7/00* | (2006.01) | |
| *B81C 1/00* | (2006.01) | |
| *H01L 23/00* | (2006.01) | |

(52) U.S. Cl.
CPC .......... *B81B 7/007* (2013.01); *B81C 1/00269* (2013.01); *H01L 24/29* (2013.01); *H01L 24/83* (2013.01); *B81B 2207/097* (2013.01); *H01L 2224/29082* (2013.01); *H01L 2224/29083* (2013.01); *H01L 2224/29109* (2013.01); *H01L 2224/29144* (2013.01); *H01L 2224/29155* (2013.01); *H01L 2224/29166* (2013.01); *H01L 2924/0132* (2013.01); *H01L 2924/01057* (2013.01); *H01L 2924/01058* (2013.01); *H01L 2924/01068* (2013.01)

(58) Field of Classification Search
CPC combination set(s) only.
See application file for complete search history.

(56) References Cited

U.S. PATENT DOCUMENTS

| | | | |
|---|---|---|---|
| 10,544,034 B1* | 1/2020 | Dadvand | H01L 24/29 |
| 2005/0006653 A1* | 1/2005 | Kwak | H01L 33/42 |
| | | | 257/79 |
| 2017/0030788 A1* | 2/2017 | Boysel | B81C 1/00301 |
| 2018/0107854 A1* | 4/2018 | Tsai | B06B 1/067 |
| 2018/0141803 A1* | 5/2018 | Schelling | B81C 1/00095 |
| 2020/0278532 A1* | 9/2020 | Lee | G01S 7/4817 |
| 2020/0283292 A1* | 9/2020 | Torkkeli | B81C 1/00301 |

* cited by examiner

*Primary Examiner* — Niki H Nguyen
(74) *Attorney, Agent, or Firm* — Dawn Jos; Charles A. Brill; Frank D. Cimino

(57) ABSTRACT

A semiconductor package including a semiconductor die and at least one bondline positioned on the semiconductor die, the at least one bondline comprising a nickel lanthanide alloy diffusion barrier layer abutting a gold layer.

15 Claims, 4 Drawing Sheets

NICKEL LANTHANIDE ALLOYS FOR MEMS PACKAGING APPLICATIONS

This application is a continuation of U.S. patent application Ser. No. 16/042,595, filed Jul. 23, 2018, the contents of which are herein incorporated by reference in its entirety.

BACKGROUND

None.

SUMMARY

In accordance with at least one example of the disclosure, a semiconductor package includes a semiconductor die and at least one bondline positioned on the semiconductor die, the at least one bondline comprising a nickel lanthanide alloy diffusion barrier layer abutting a gold layer. In aspects, the at least one bondline further comprises at least one other bondline layer, wherein the nickel lanthanide alloy diffusion barrier layer does not alloy with the at least one other bondline layer. In aspects, the at least one other bondline layer comprises indium, a seed metal, a base metal, or a combination thereof. The base metal can comprise copper and/or the seed metal can comprise titanium, in aspects. In aspects, the semiconductor die comprises a complementary metal-oxide semiconductor (CMOS).

In accordance with at least one example of the disclosure, a Micro-Electro-Mechanical System (MEMS) package comprises a semiconductor die, a substrate spaced apart from the semiconductor die, and a bondline positioned between and in contact with the semiconductor die and the substrate, the bondline comprising a nickel lanthanide alloy diffusion barrier layer and a gold layer. In aspects, the substrate comprises a semiconductor die. In aspects, the MEMS package further comprises indium incorporated into the bondline as an interlayer element for transient liquid phase bonding between the gold and the indium. In aspects, the lanthanide comprises cerium, lanthanum, erbium, or a combination thereof. In aspects, the MEMS package includes a digital micromirror device (DMD). In aspects, the MEMS package further comprises one or more layers comprising a seed metal, a base metal, or both.

In accordance with at least one example of the disclosure, a semiconductor package comprises a nickel lanthanide alloy diffusion barrier layer, and a gold layer abutting the nickel lanthanide alloy diffusion barrier layer. In aspects, a bondline comprising the nickel lanthanide alloy diffusion barrier layer and the gold layer further comprises nickel, copper, indium, or a combination thereof. In aspects, the lanthanide comprises cerium, lanthanum, erbium, or a combination thereof.

In accordance with at least one example of the disclosure, a method of fabricating a Micro-Electro-Mechanical System (MEMS) package comprises, for each of two substrates, depositing a nickel lanthanide alloy diffusion barrier layer on the substrate, depositing a gold layer on the nickel lanthanide alloy diffusion barrier layer, aligning outer perimeters of the at least two substrates, with the deposited layers facing each other, and forming a bondline between the at least two substrates via the application of heat, force, or both to the nickel lanthanide alloy diffusion barrier layer and the gold layer. In aspects, at least one of the two substrates comprises a wafer. In aspects, the method further comprises providing one or more additional layers on each of the at least two substrates prior to depositing the nickel lanthanide alloy diffusion barrier layer. The one or more additional layers can comprise a seed metal, a base metal, or both. In aspects, the seed metal comprises titanium, and the base metal comprises copper, or the seed metal comprises titanium and the base metal comprises copper. The method can further comprise depositing the one or more additional layers via chemical vapor deposition (CVD). Depositing of the nickel lanthanide alloy diffusion barrier layer can be effected via reversed pulse electrodeposition, in aspects. The bondline can further comprise a transient liquid phase bonding between gold and indium.

BRIEF DESCRIPTION OF THE DRAWINGS

For a detailed description of various examples, reference will now be made to the accompanying drawings in which.

DETAILED DESCRIPTION

Figure 1A:
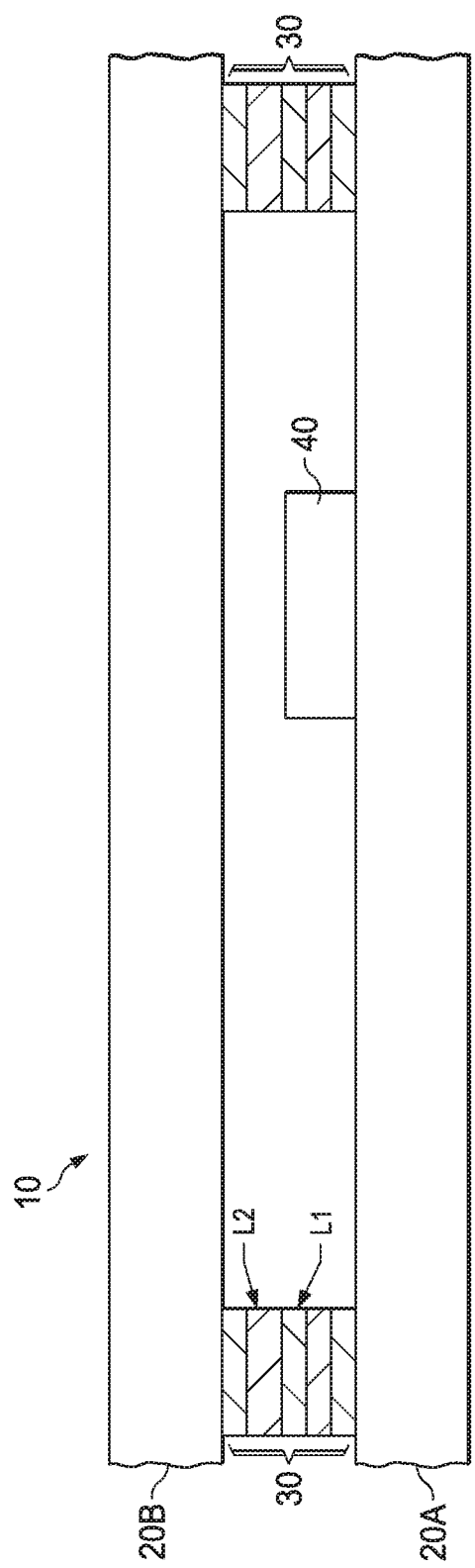
FIG. 1A shows a Micro-Electro-Mechanical System (MEMS) package in accordance with various examples.

Micro-Electro-Mechanical System (MEMS) sensors and actuators are becoming increasingly common. MEMS packages are utilized to encapsulate such MEMS devices to prevent exposure of the external environment to components of the MEMS device via a hermetic seal.

Metals are often utilized in interfaces, such as bondlines, between substrates of MEMS packages. Diffusion of metals within such interfaces can lead to undesirable interaction of metal components. For example, when a gold layer is utilized as a component of a MEMS package interface or bondline, diffusion of one or more other metals utilized in the interface or bondline into the gold layer can lead to an uneconomical use of excess gold and potential reliability failures in the interface or bondline. As utilized herein, a 'bondline' indicates a structure connecting substrates and sealing a mini-environment around a device (e.g., a MEMS).

Electroplated nickel is widely used as a diffusion barrier layer for MEMS applications. As utilized herein, a 'diffusion barrier layer' is a layer that reduces, minimizes, or prevents diffusion of metals between metal layers. However, it is not considered an efficient diffusion barrier layer. For example, in some hermetic MEMS packaging applications, a thin layer of pure nickel is coated with a thick layer of gold and bonded in a transient liquid phase process with an indium coated wafer. However, the gold in such applications is not only consumed by the indium during bond, but also, over time, by the nickel. The nickel in such a pure nickel diffusion barrier layer not only interacts with the gold, but can also interact with other metals present in the interface or bondline. For example, a pure nickel diffusion barrier layer can interact with indium employed for an above-noted transient liquid phase bond of the gold and indium and can also interact with a base metal, such as copper, present in the interface or bondline. Another solution to the problem of metal diffusion is the use of pure gold as a base metal, which eliminates the use of nickel in the interface or bondline, but is not economical.

A desirable solution to the metal diffusion problem noted above would be the discovery of a metallurgy for a diffusion barrier layer that does not require a change in the base metal, does not consume gold or other metals (e.g., indium), and does not alloy with other layers of the interface or bondline. It has been unexpectedly discovered that the use of a nickel lanthanide alloy rather than pure nickel as a diffusion barrier layer prevents the inter-diffusion of nickel and gold, allowing more gold to be available in bond. Due to the reduced consumption of gold, a reduction in the amount of gold utilized in plating (e.g., a reduction in the thickness of gold in the interface or bond) is also enabled. Accordingly, the use of a nickel lanthanide alloy diffusion barrier layer in a MEMS package as per this disclosure provides for the partial replacement of gold with a nickel lanthanide alloy. Due to the lanthanide alloying element(s), a nickel lanthanide alloy diffusion barrier layer according to this disclosure provides an efficient diffusion barrier layer (e.g., prevents inter-diffusion of nickel and/or other metals, such as base metals, into a gold layer), provides enhanced corrosion resistance, and, by replacing other precious metal platings, can provide cost savings. It is noted that the nickel of the herein-disclosed interface or bond layer is not utilized as a soldering element in aspects of the herein-disclosed MEMS packages.

According to various examples, a MEMS package of this disclosure comprises a nickel lanthanide alloy diffusion barrier layer and a gold layer abutting the nickel lanthanide alloy diffusion barrier layer. The MEMS package can be utilized to package any MEMS device. By way of examples, the MEMS package can be a semiconductor package, such as, without limitation, a digital micromirror device (DMD) package. The MEMS package can be hermetic, in aspects. The MEMS package can further comprise at least two substrates, with an interface or bondline therebetween comprising a nickel lanthanide alloy diffusion barrier layer as disclosed herein. For example, FIG. 1A depicts a cross section view of a MEMS package 10 comprising first substrate 20A and second substrate 20B with bondline 30 therebetween and MEMS 40 positioned on first substrate 20A. The bondline comprises at least a gold layer L1 abutting a nickel lanthanide alloy diffusion barrier layer L2. The MEMS package can be any suitable shape, such as, without limitation, rectangular or square, and the bondline can run along the perimeter thereof. Although indicated on the left and right sides of the cross section of FIG. 1A, it is to be understood that a bondline may run continuously around the perimeter of the MEMS package. The bondline may be a hermetic bondline around MEMS 40.

Figure 1B:
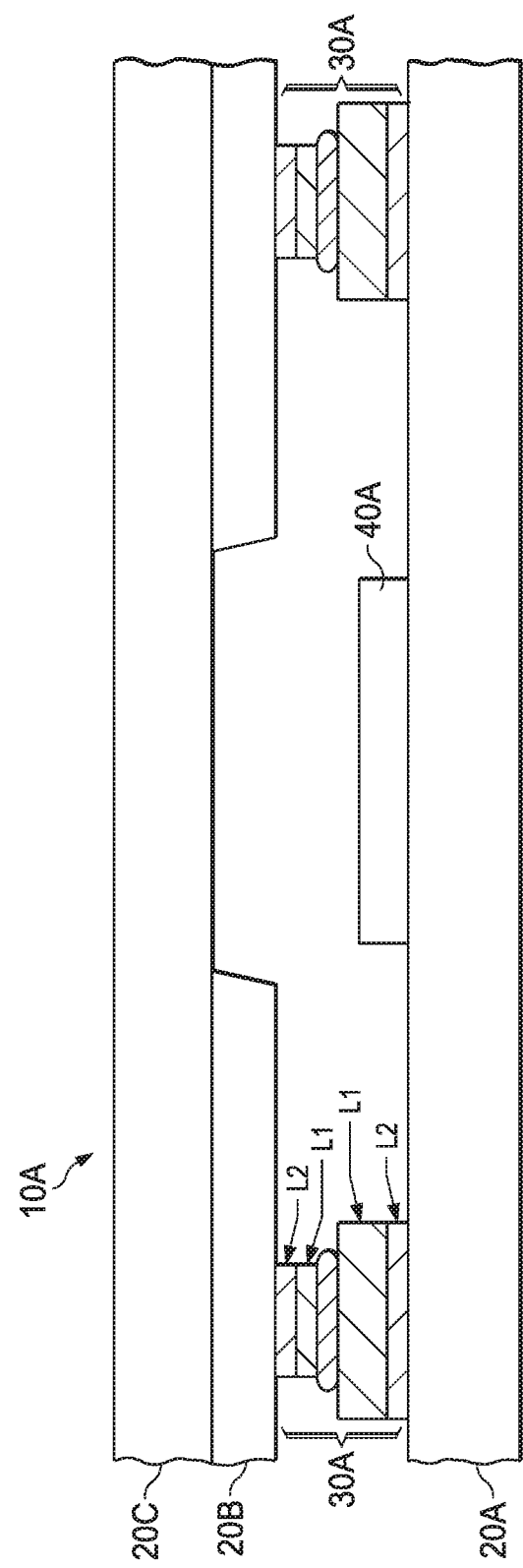
FIG. 1B shows a digital micromirror device (DMD) package in accordance with various examples.

First substrate 20A and second substrates 20B can be any suitable substrates known to those of skill in the art. According to various examples, at least one of first substrate 20A and second substrate 20B comprises a semiconductor wafer, such as, without limitation, a complementary metal-oxide semiconductor (CMOS) wafer. As described in detail hereinbelow, in aspects, the MEMS package is formed by singulating a wafer into a number of die. In such aspects, the substrate is referred to herein as a wafer prior to singulation and a wafer or die subsequent singulation. The MEMS package can comprise additional substrates, in various aspects. For example, FIG. 1B shows a MEMS package 10A in accordance with various examples of this disclosure. MEMS package 10A comprises a first substrate 20A comprising a CMOS wafer 20A, a second substrate 20B comprising a window assembly wafer 2, and a third substrate 20C comprising a window assembly wafer 1. As utilized herein, a 'window assembly' refers to a substrate devised to allow light into a MEMS package. Window wafer assembly 1 can comprise glass, and window wafer assembly 2 can comprise a silicon wafer, in aspects. Second substrate 20B comprising the window assembly wafer 2 is bonded to first substrate 20A comprising the CMOS wafer via bondline 30A, which comprises at least one gold layer L1 abutting a nickel lanthanide alloy diffusion barrier layer L2. In this example, MEMS 40A can comprise a DMD.

Figure 2:
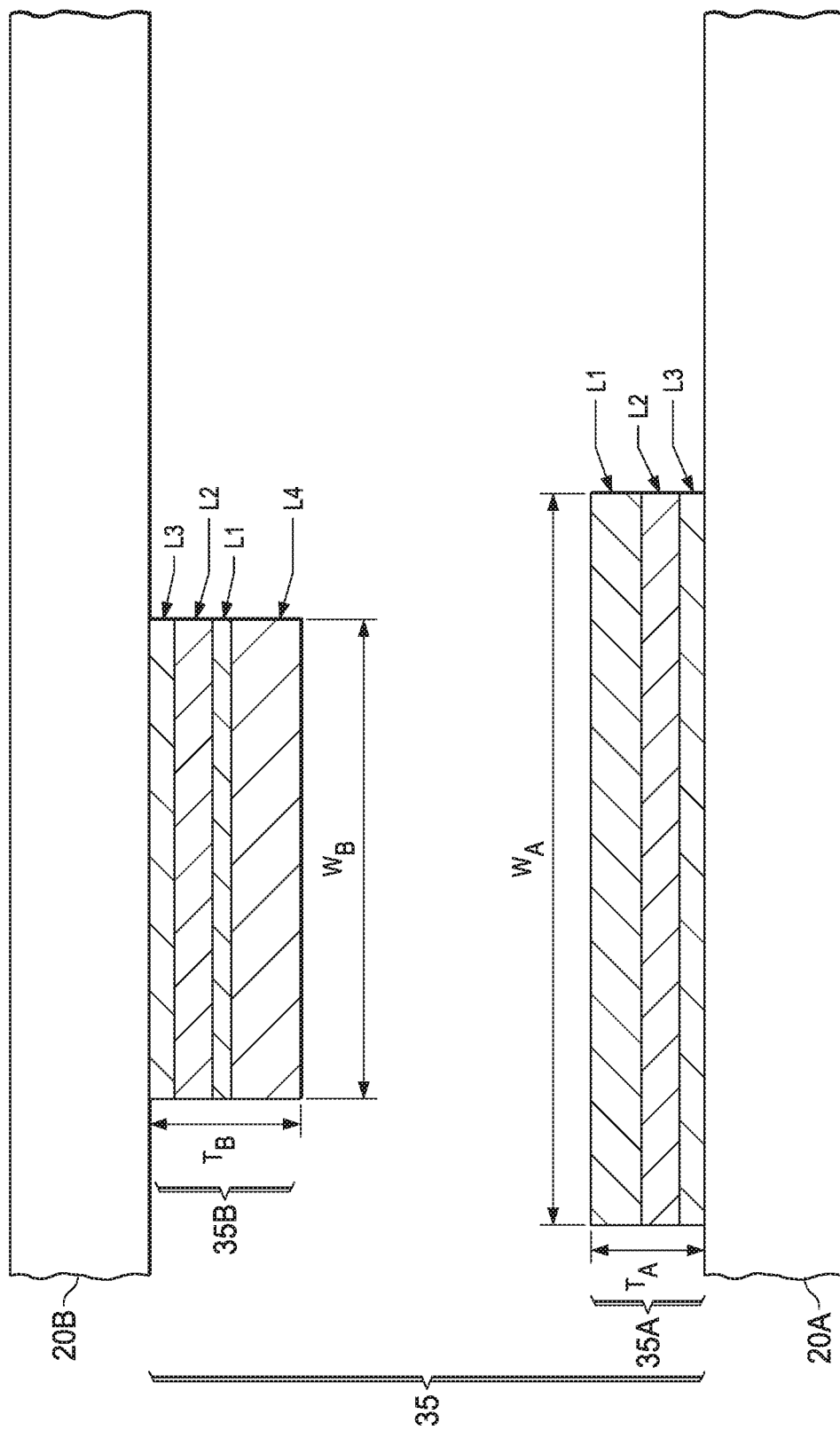
FIG. 2 shows a plating stack in accordance with various examples.

The plating stack refers to the plating layers situated between the first substrate 20A and the second substrate 20B prior to bonding. A bondline according to this disclosure can be produced via any plating stack comprising a nickel lanthanide alloy diffusion barrier layer directly adjacent to (or 'abutting') a gold layer. By way of non-limiting example, FIG. 2 shows a plating stack 35 in accordance with various examples of this disclosure. In the example of FIG. 2, the plating stack 35 comprises a first substrate plating stack 35A on the first substrate 20A and a second substrate plating stack 35B on the second substrate 20B. First substrate plating stack 35A comprises a titanium/copper layer L3 deposited on first substrate 20A, a nickel lanthanide alloy diffusion barrier layer L2 atop the titanium/copper layer L3, and a gold layer L1 abutting and atop the nickel lanthanide alloy diffusion barrier layer L2. In the example of FIG. 2, the second substrate plating stack 35B comprises a titanium/copper layer L3 deposited on second substrate 20B, a nickel lanthanide alloy diffusion barrier layer L2 atop the titanium/copper layer L3, a gold layer L1 abutting and atop the nickel lanthanide alloy diffusion barrier layer L2, and an indium layer L4 atop the gold layer L1. Titanium may be a seed layer for adhesion onto the substrate (e.g., onto a silicon substrate), and copper may be the base metal. It is to be understood that other seed metals and base metals are within the scope of this disclosure.

In aspects, such as depicted in FIG. 2, the first substrate plating stack 35A has a greater width (e.g., an extent in a direction from an outer perimeter of the substrate to a center thereof) $W_A$ than a width $W_B$ of the second substrate plating stack 35B. In aspects, the first substrate plating stack 35A has a width $W_A$ in a range of from about 10 μm to about 700 μm, from about 100 μm to about 600 μm, or from about 300 μm to about 400 μm. In aspects, the second substrate plating stack 35B has a width $W_B$ in a range of from about 10 μm to about 700 μm, from about 100 μm to about 600 μm, or from about 150 μm to about 200 μm. In aspects, a ratio of the width of the first substrate plating stack to the width of the second substrate plating stack, $W_A/W_B$, is about 1.0, 1.7, or 3.0.

In aspects, the first substrate plating stack 35A has a thickness $T_A$ in a range of from about 0.1 μm to about 100 μm, from about 1.0 μm to about 5.0 μm, or from about 3.5 μm to about 4.0 μm. In aspects, the second substrate plating stack has a thickness $T_B$ in a range of from about 0.1 μm to about 100 μm, from about 1.0 μm to about 20 μm, or from about 5.0 μm to about 10.0 μm. In aspects, the ratio of the thickness of the first substrate plating stack to the thickness of the second substrate plating stack, $T_A/T_B$, is about 0.1, 1.0, or 10. The plating stack 35 of FIG. 2 may be suitable, for example, for applications in which the MEMS comprises a DMD. Other plating stacks comprising a variety of layers are within the scope of this disclosure and will be apparent to those of skill in the art upon reading this disclosure.

In aspects, the nickel lanthanide alloy diffusion barrier layer has a thickness in a range of from about 0.1 μm to about 20 μm. In aspects, a nickel lanthanide alloy diffusion barrier layer on the first substrate has a thickness in a range of from about 0.1 μm to about 20 μm, from about 0.2 μm to about 1.0 μm, or from about 0.25 μm to about 0.5 μm. In aspects, a nickel lanthanide alloy diffusion barrier layer on the second substrate has a thickness in a range of from about 0.1 µm to about 20 µm, from about 0.2 µm to about 1.0 µm, or from about 0.25 µm to about 0.5 µm. In aspects, the nickel lanthanide alloy diffusion barrier layer has a width in a range of from about 300 µm to about 400 µm. In aspects, a width of a nickel lanthanide alloy diffusion barrier layer on the first substrate is greater than a width of a nickel lanthanide alloy diffusion barrier layer on the second substrate. In aspects, the nickel lanthanide alloy diffusion barrier layer on the first substrate has a width in a range of from about 10 µm to about 700 µm, from about 100 µm to about 600 µm, or from about 300 µm to about 400 µm. In aspects, the nickel lanthanide alloy diffusion barrier layer on the second substrate has a width in a range of from about 10 µm to about 700 µm, from about 100 µm to about 600 µm, or from about 150 µm to about 200 µm. In aspects, described further hereinbelow with reference to FIG. 3A, a nickel lanthanide alloy diffusion barrier layer comprises multiple layers of deposited nickel lanthanide alloy, for example, 2 or 3. In aspects, a first layer of nickel lanthanide deposited on the substrate has a grain size in a range of from about 1 nm to about 100 nm, a lanthanide content or fraction in a range of from about 0.1 percent by weight (0.1% wt) to about 20% wt, or a combination thereof. In aspects, a second layer of nickel lanthanide deposited on the first layer of nickel lanthanide alloy deposited on the substrate has a grain size in a range of from about 1 nm to about 100 nm, a lanthanide content or fraction in a range of from about 0.1% wt to about 20% wt, or a combination thereof. In aspects, a third layer of nickel lanthanide deposited on the second layer of nickel lanthanide alloy deposited on the substrate has a grain size in a range of from about 1 nm to about 100 nm, a lanthanide content or fraction in a range of from about 0.1% wt to about 20% wt, or a combination thereof.

In aspects, the gold layer has a thickness in a range of from about 0.1 µm to about 20 µm, from about 1 µm to about 10 µm, or from about 2 µm to about 5 µm. In aspects, a gold layer on the first substrate has a thickness in a range of from about 0.1 µm to about 20 µm, from about 1 µm to about 10 µm, or from about 2 µm to about 5 µm, and a gold layer on the second substrate has a thickness in a range of from about 0.1 µm to about 20 µm, from about 1 µm to about 10 µm, or from about 2 µm to about 5 µm. In aspects, due to the efficiency provided by the herein-disclosed nickel lanthanide alloy diffusion barrier layer, a total thickness of gold deposited in the plating stack (e.g., within first substrate plating stack 35A on first substrate 20A and/or second substrate plating stack 35B on second substrate 20B) is less than a total thickness of gold utilized with a pure nickel diffusion barrier layer.

Figure 3A:
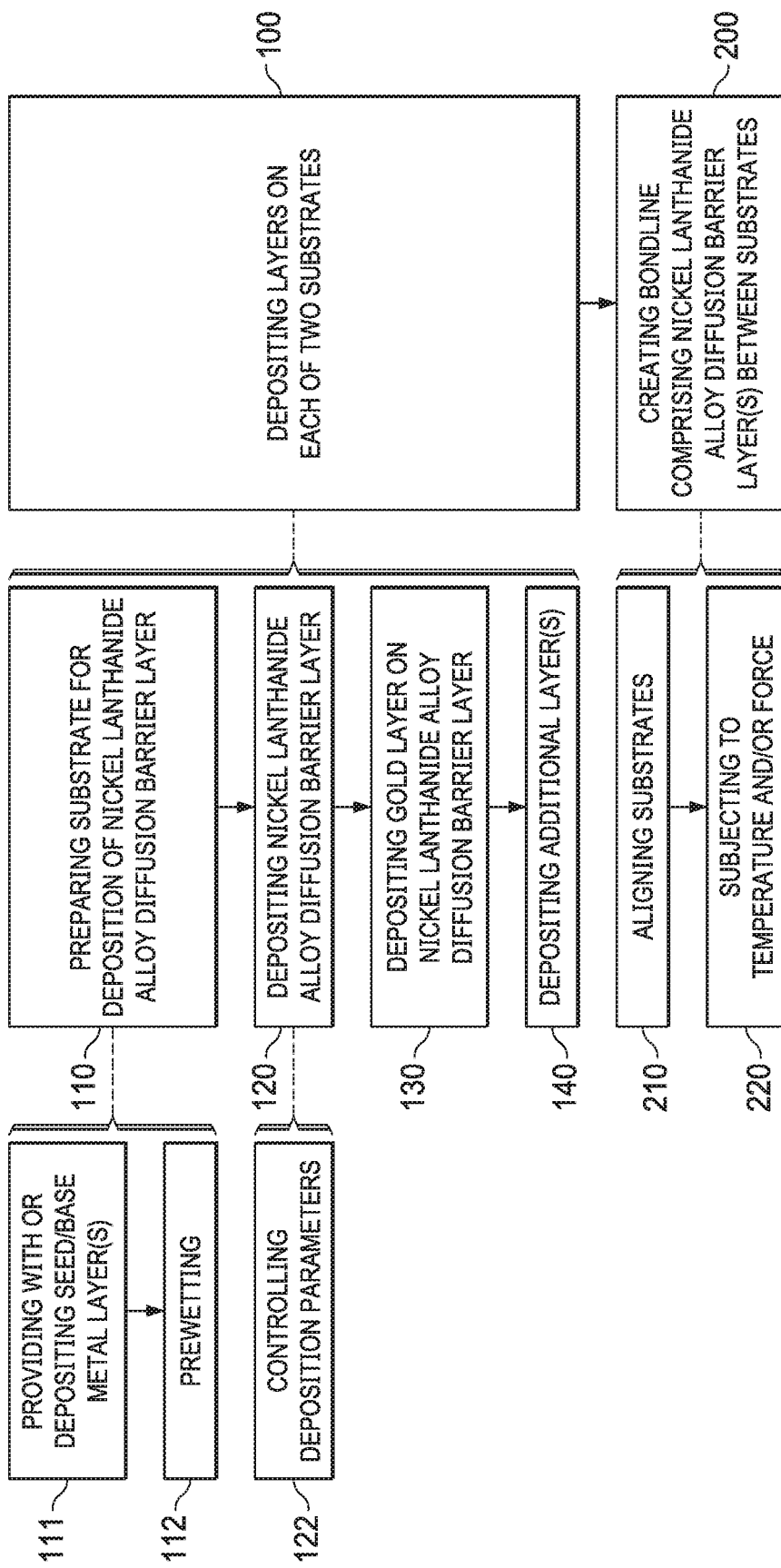
FIG. 3A shows a flowchart for a method of fabricating a MEMS package in accordance with various examples.

FIG. 3A shows a flowchart for a method I of fabricating a MEMS package in accordance with various examples of this disclosure. Method I of fabricating a MEMS package comprises depositing layers of a plating stack on each of two substrates at step 100 and creating a bondline comprising a nickel lanthanide alloy diffusion barrier layer abutting a gold layer at step 200.

As depicted in FIG. 3A, depositing layers of a plating stack on each of two substrates at step 100 comprises depositing a nickel lanthanide alloy diffusion barrier layer at step 120 and depositing a gold layer on the nickel lanthanide alloy diffusion barrier layer at step 130. The lanthanide can comprise an element from the lanthanide series of elements, such as, without limitation, cerium, lanthanum, erbium, or a combination thereof. Depositing a nickel lanthanide alloy diffusion barrier layer at step 120 can comprise depositing the nickel lanthanide alloy by electroplating. In various aspects, electroplating of the nickel lanthanide alloy diffusion barrier layer can be effected via reversed pulse electrodeposition. The nickel lanthanide alloy diffusion barrier layer may have the thicknesses, widths, and compositions noted above.

As indicated in the exemplary flowchart of FIG. 3A, depositing the nickel lanthanide alloy diffusion barrier layer at step 120 can further comprise controlling deposition parameters utilized during deposition at step 122. Controlling deposition parameters at step 122 can be utilized to control lanthanide alloy deposition to nickel grain boundaries to prevent diffusion of metals to or from other layers (e.g., nickel from the nickel lanthanide alloy diffusion barrier layer to the gold layer or a base metal from a base metal layer, such as copper, to the nickel lanthanide alloy diffusion barrier layer) along the grain boundaries. In examples, the nickel lanthanide alloy diffusion barrier layer can comprise multiple layers of deposited nickel lanthanide alloy. In aspects, such multiple layers of deposited nickel lanthanide alloy can be deposited in a single step via reversed pulse electrodeposition. The multiple layers of deposited nickel lanthanide alloy of such a nickel lanthanide alloy diffusion barrier layer can vary in nickel grain size and/or lanthanide alloy content (e.g., a ratio of nickel to lanthanide) to restrict or prevent diffusion of nickel or a base metal such as copper to the gold layer abutting the nickel lanthanide alloy diffusion barrier layer. In such applications, the grain size of the nickel and/or a content of nickel lanthanide alloy in the multiple layers of deposited nickel lanthanide alloy may increase from a side of the nickel lanthanide alloy diffusion barrier layer distal the gold layer to a side of the nickel lanthanide alloy diffusion barrier layer proximate the gold layer. In aspects, the nickel lanthanide alloy diffusion barrier layer comprises dislocations, which may also reduce migration of a metal deposited between the substrate and the nickel lanthanide alloy diffusion barrier layer (e.g., copper from a copper base metal layer) or nickel from the nickel lanthanide alloy diffusion barrier layer to the gold layer. Controlling deposition parameters at step 122 can include controlling the deposition to provide a desired number of layers of nickel lanthanide alloy in the nickel lanthanide alloy diffusion barrier layer, a grain size throughout the nickel lanthanide alloy diffusion barrier layer, a content of lanthanide alloy throughout the nickel lanthanide alloy diffusion barrier layer, a thickness of the nickel lanthanide alloy diffusion barrier layer, or a combination thereof. Deposition parameters include, without limitation, the temperature of deposition, a current used for deposition, a chemical makeup of a nickel lanthanide alloy bath utilized during deposition (e.g., complexing agent(s) utilized, concentration range), a time of deposition, or a combination thereof.

As depicted in FIG. 3A, depositing layers of a plating stack on each of two substrates at step 100 comprises depositing a gold layer on the nickel lanthanide alloy diffusion barrier layer at step 130. The gold layer may be deposited by electroplating and may have the thicknesses noted above.

As depicted in FIG. 3A, depositing layers of a plating stack on each of two substrates 100 can further comprise preparing each substrate for deposition of the nickel lanthanide alloy diffusion barrier layer at step 110. The substrates can be prepared for deposition of the nickel lanthanide alloy diffusion barrier layer by any methods known to those of skill in the art. In aspects, as indicated in the exemplary flowchart of FIG. 3A, preparing the substrate for deposition of the nickel lanthanide alloy diffusion barrier layer at step 110 can comprise providing a substrate with a seed layer, a base metal layer, or both thereon, or depositing a seed layer, a base metal layer, or both on the substrate at step 111. In aspects, a seed layer comprises titanium. In aspects, a base metal layer comprises copper. In aspects, depositing a seed layer, a base metal layer, or both on the substrate at step 111 is effected via chemical vapor deposition (CVD). Preparing the substrate for deposition of the nickel lanthanide alloy diffusion barrier layer at step 110 can further comprise prewetting the substrate at step 112. Prewetting can be effected by any methods known in the art, for example cleaning with deionized (DI) water.

As indicated in the exemplary flowchart of FIG. 3A, depositing layers of the plating stack on each of two substrates at step 100 can further comprise depositing, at step 140, one or more additional layers on the gold layer deposited at step 130. For example, in aspects, an indium layer is deposited on one of the substrates. Other additional layers are within the scope of this disclosure.

As noted above, a method of fabricating a MEMS package according to this disclosure comprises creating a bondline comprising a nickel lanthanide alloy diffusion barrier layer abutting a gold layer at step 200. As depicted in the flowchart of FIG. 3A, the bondline can be created by aligning the substrates at step 210 and subjecting the aligned substrates to temperature and/or bond force to melt the plating stack and form the bondline at step 220. Aligning the substrates at step 210 can comprise aligning the outer perimeters of the two wafers with the deposited layers of the first substrate contacting the deposited layers of the second substrate stack. Subjecting to temperature and/or bond force at step 220 to form the bondline can comprise subjecting the aligned substrates to a temperature in a range of from about 25° C. to about 350° C., from about 100° C. to about 250° C., or from about 175° C. to about 200° C., a bond force in the range of from about 0.1 kN to about 100 kN, from about 5 kN to about 40 kN, or from about 10 kN to about 20 kN, or a combination thereof. In applications, the method produces a wafer stack assembly for singulation. Other steps may be included in the method, for example between the plating of the substrates and substrate bonding (e.g., between steps 100 and 200). The MEMS, such as a DMD, may be incorporated into the MEMS package via standard semiconductor packaging steps following the bond process. Without limitation, such steps may include, for example, singulation, die attach, encapsulation, wire bond, etc.

Figure 3B:
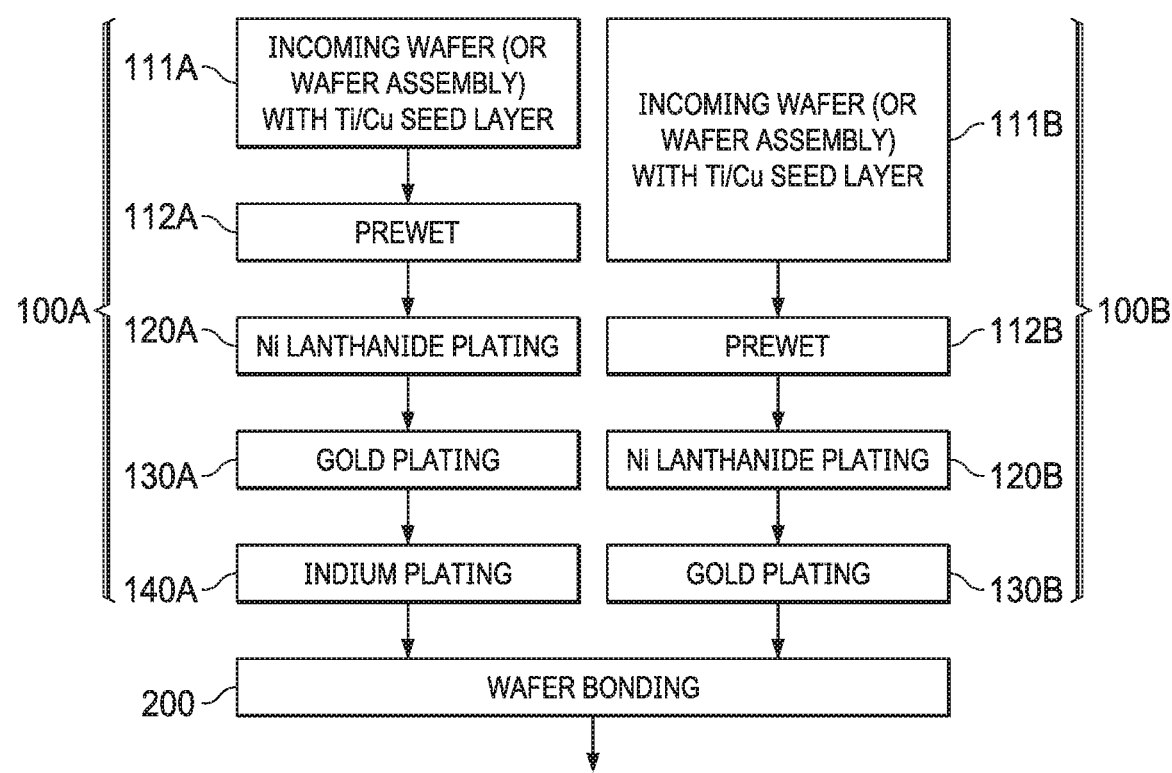
FIG. 3B shows a flowchart for a method of fabricating a MEMS package in accordance with various examples.

FIG. 3B shows a flowchart for a method IA of fabricating a MEMS package in accordance with various examples. Method IA comprises depositing layers of a first substrate plating stack on a first substrate at step 100A and depositing layers of a second substrate plating stack on a second substrate at step 100B. In specific aspects, one of the first substrate and the second substrate is a CMOS wafer and the other substrate comprises a window assembly. As depicted in the exemplary flowchart of FIG. 3B, depositing layers of a first substrate plating stack on a first substrate at step 100A and depositing layers of a second substrate plating stack on a second substrate at step 100B comprise nickel lanthanide plating at steps 120A and 120B, respectively, and gold plating at steps 130A and 130B, respectively. Depositing layers of the first substrate plating stack on the first substrate at step 100A and depositing layers of the second substrate plating stack on the second substrate at step 100B can further comprise providing an incoming wafer assembly with a titanium/copper layer at steps 111A and 11B, respectively and/or prewetting prior to nickel lanthanide plating at steps 112A and 112B, respectively. In specific applications, depositing layers of a plating stack on the first substrate at step 100A further comprises indium plating at step 140A. The indium layer of the plating stack may be utilized to form an intermetallic between gold and indium via transient liquid phase bonding. In some aspects, a width of a plating stack comprising indium is less than a width of a plating stack not comprising indium to prevent indium from extending beyond the bondline during bonding at step 200.

Method IA further comprises wafer bonding at step 200 to bond the substrates and thus produce a stack assembly for singulation. The bonding may be effected as described hereinabove with reference to step 200 of the exemplary flowchart of FIG. 3A. Again, as noted above, other steps may be included in the method, for example between the plating of the substrates and substrate bonding.

In the foregoing discussion and in the claims, the terms "including" and "comprising" are used in an open-ended fashion, and thus should be interpreted to mean "including, but not limited to . . . ." Unless otherwise stated, "about," "approximately," or "substantially" preceding a value means +/−10 percent of the stated value.

The above discussion is meant to be illustrative of the principles and various aspects of the present disclosure. Numerous variations and modifications will become apparent to those skilled in the art once the above disclosure is fully appreciated. It is intended that the following claims be interpreted to embrace all such variations and modifications.

What is claimed is:

1. A semiconductor package comprising:
   a semiconductor die; and
   a nickel lanthanide alloy layer abutting a gold layer positioned on the semiconductor die.

2. The semiconductor package of claim 1 further comprising indium, a seed metal, a base metal, or a combination thereof on the nickel lanthanide alloy layer.

3. The semiconductor package of claim 2, wherein the base metal comprises copper, and wherein the seed metal comprises titanium, or both.

4. The semiconductor package of claim 1, wherein the semiconductor die comprises a complementary metal-oxide-semiconductor (CMOS).

5. A Micro-Electro-Mechanical System (MEMS) package, comprising:
   a first substrate;
   a micro-electro-mechanical system (MEMS) device attached to the first substrate;
   a second substrate spaced apart from the first substrate;
   a third substrate on the second substrate; and
   a bondline in contact with the first substrate and the second substrate, the bondline comprising a nickel lanthanide alloy layer and a gold layer.

6. The MEMS package of claim 5, wherein the first substrate, the second substrate, and the third substrate comprise portion of a semiconductor wafer.

7. The MEMS package of claim 5, wherein the second substrate and the third substrate comprise portion of a window assembly wafer.

8. The MEMS package of claim 5, wherein the third substrate comprises glass.

9. The MEMS package of claim 5 further comprising indium incorporated into the bondline as an interlayer element for transient liquid phase bonding between the gold and the indium.

10. The MEMS package of claim 5, wherein the lanthanide comprises cerium, lanthanum, erbium, or a combination thereof.

11. The MEMS package of claim 5, wherein the gold layer has a thickness in a range of from about 0.1 μm to about 20 μm.

12. The MEMS package of claim 5, further comprising one or more layers comprising a seed metal, a base metal, or both.

13. A semiconductor package, comprising:
   a structure electrically connecting two substrates, comprising:
   a layer including nickel and lanthanide; and
   a gold layer abutting the layer.

14. The semiconductor package of claim 13, wherein a bondline comprising the layer and the gold layer further comprises nickel, copper, indium, or a combination thereof.

15. The semiconductor package of claim 14, wherein the lanthanide comprises cerium, lanthanum, erbium, or a combination thereof.

* * * * *